(12) United States Patent
Roohparvar

(10) Patent No.: US 6,747,911 B2
(45) Date of Patent: Jun. 8, 2004

(54) SYNCHRONOUS MEMORY WITH OPEN PAGE

(75) Inventor: Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/225,324

(22) Filed: Aug. 21, 2002

(65) Prior Publication Data

US 2004/0037157 A1 Feb. 26, 2004

(51) Int. Cl.7 .................................................. G11C 8/00
(52) U.S. Cl. ................... 365/233; 365/189.05; 365/226
(58) Field of Search ............................ 365/233, 189.05, 365/226, 227

(56) References Cited

U.S. PATENT DOCUMENTS 5,438,548 A * 8/1995 Houston ..................... 365/227
5,574,697 A   11/1996 Manning
5,670,906 A   9/1997  Roohparvar
5,801,585 A   9/1998  Roohparvar
5,818,780 A   10/1998 Manning
5,955,913 A   9/1999  Roohparvar
2002/0075724 A1  6/2002  Pekny
2002/0126561 A1  9/2002  Roohparvar

* cited by examiner

Primary Examiner—Huan Hoang
(74) Attorney, Agent, or Firm—Leffert Jay & Polglaze, P.A.

(57) ABSTRACT

A synchronous memory device includes an array of memory cells. During a read operation data from a row of the array is stored in a latch circuit and randomly read. The memory device can be placed in a low power consumption mode where a voltage pump circuit used to provide an access voltage is powered down. The time required to restart the voltage pump typically limits the speed in which data in the array can be read following a low power mode. The memory device maintains power to the latch circuit during the low power mode such that the latched data can be read following a low power mode without waiting for the pump circuit to reach a stable output voltage level.

20 Claims, 2 Drawing Sheets

SYNCHRONOUS MEMORY WITH OPEN PAGE

FIELD OF THE INVENTION

The present invention relates generally to memory devices and in particular the present invention relates to non-volatile memory and data access.

BACKGROUND OF THE INVENTION

A Flash memory is a type of memory that can be erased and reprogrammed in blocks instead of one byte at a time. A typical Flash memory comprises a memory array, which includes a large number of memory cells. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Similar to random access memory devices, synchronous flash memory devices have memory cells that are typically arranged in an array of rows and columns. During operation, a row (page) is accessed and then memory cells can be randomly accessed on the page by providing column addresses. This access mode is referred to as page mode access. To read or write to multiple column locations on a page requires the external or internal application of multiple column addresses.

The synchronous flash memory devices can be used in new generations of handheld products. These products include handheld personal digital assistants (PDA's) as well as some cell phones. The need for lower power and higher performance is essential in these types of applications.

Flash devices have historically had several current usage specifications. The active current, or ICC Active, is the current consumption level of the memory device when the part is being accessed either for reading or writing operations. These currents range from 40 to 100 mA for different flash memory families. Then there is the Standby current. This current refers to the level of current when the memory is not enabled. For example, the standby current is a mode in which the CE, or chip enable, pin is de-asserted. A typical current consumption of the standby state is in the range of 100 to 400 $\mu$A. Most flash memory devices have a lower power mode, which is referred to as deep power down. The current consumption of this mode is in the 10's of $\mu$A range. Reading data from the memory device following the termination of a deep power down state requires a relatively long wait.

For the reasons stated above, and for other reasons stated below which will become apparent to those skilled in the art upon reading and understanding the present specification, there is a need in the art for a non-volatile memory device that can conserve power without slowing data access.

SUMMARY OF THE INVENTION

The above-mentioned problems with non-volatile memory devices and other problems are addressed by the present invention and will be understood by reading and studying the following specification.

In one embodiment, a synchronous memory device comprises a memory array, latch circuitry coupled to store data read from the memory array, and control circuitry to receive an externally provided command to place the synchronous memory device in a low power consumption mode. The synchronous memory device maintains power to the latch circuitry during the low power consumption mode.

In another embodiment, a flash memory device comprises an array of non-volatile memory cells arranged in rows and columns, latch circuitry coupled to store data read from a row of the memory array, and control circuitry to place the memory device in a low power mode by decoupling power to the array. The memory device maintains power to the latch circuitry during the low power mode, and the control circuitry allows the stored data in the latch circuitry to be read by an external device following a termination of the low power mode.

A method of operating a flash memory device comprises accessing a page of data of a memory array, latching the accessed page, and powering down the flash memory device to a low power state. A voltage pump provided to generate all elevated access voltage is turned off. The method further comprises powering up the flash memory device such that the voltage pump is turned on. The voltage pump requires X seconds to reach a stable pumped output voltage. The latched page is read during the X seconds and prior to the voltage pump reaching a stable pumped output voltage.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

As explained above flash memory devices, like many electronic devices used in battery powered systems, need to have power conservation modes. By providing a range of different power consumption modes, the user or system can select the impact on operation characteristics. For example, in some prior non-volatile flash memory devices a deep power down mode is achieved by turning off all circuitry that draw any current from the power supply. Flash memory devices require voltage levels for read operation that are above the supply voltage, Vcc. One such voltage is Vpx, which is a voltage used for the word line signal used to access a row of memory cells. Vpx is internally pumped from the Vcc supply, using pump circuit 180, see FIG. 1 described below. The Vpx node has a lot of capacitance and with a reasonable pump, it can take 100's of nanoseconds to reach the desired Vpx voltage level. As such, there is a prior flash memory timing specification that requires over 1 $\mu$S to read data from the memory following a termination of power down (a Reset pin is asserted).

This timing specification may make the power down feature a non-usable option for the end user. That is, in order to take advantage of the lower power, the user would have to wait a long time to start a read cycle. Embodiments of the present invention provide a non-volatile memory device and methods of operation that improve the above situation by allowing the end user to take advantage of the lower power consumption while being allowed to read a reasonable amount of data very fast. Prior to describing the data access features in greater detail, a description of a flash memory device of one embodiment of the present invention is described.

Figure 1:
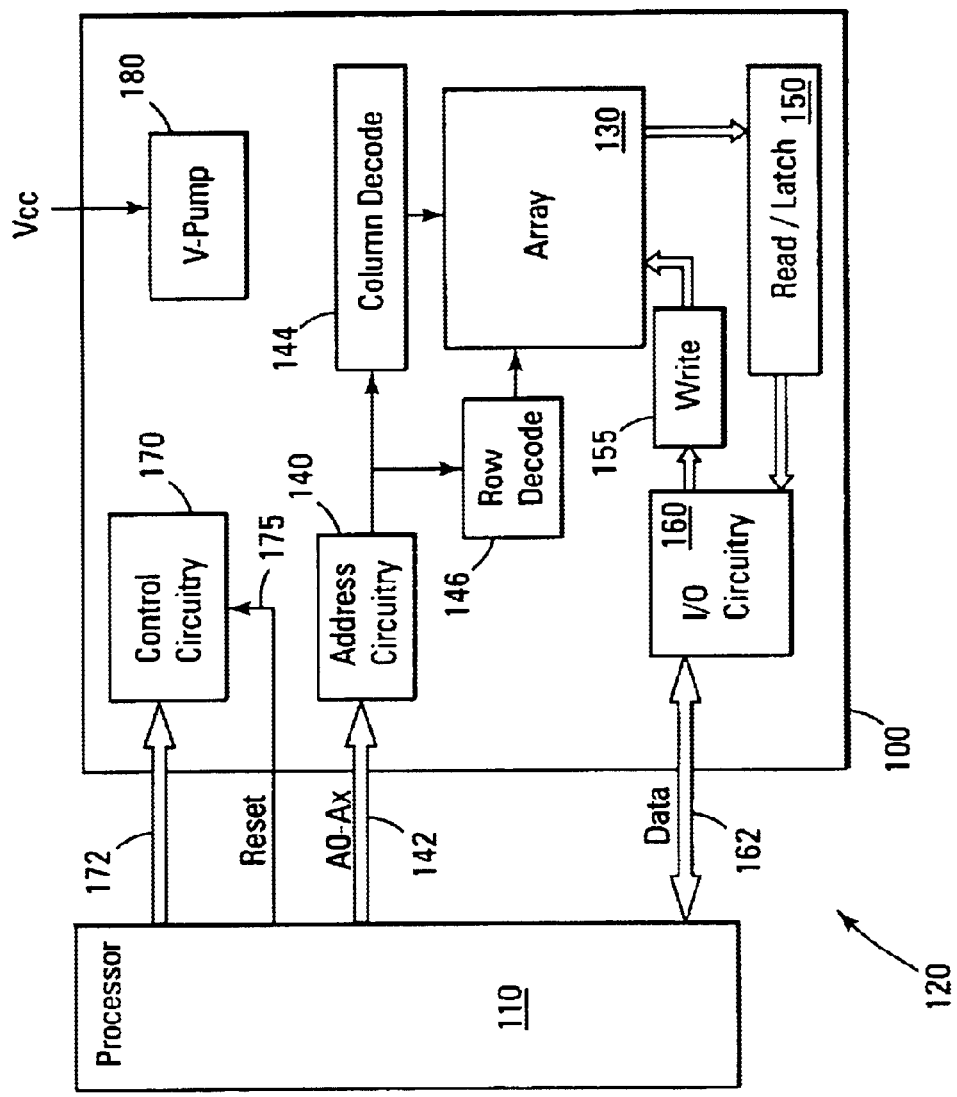
FIG. 1 illustrates a non-volatile memory device of one embodiment of the present invention.

FIG. 1 is a functional block diagram of a memory device 100, of one embodiment of the present invention, that is coupled to a processor 110. The memory device 100 and the processor 10 may form part of an electronic system 120. The memory device 100 has been simplified to focus on features of the memory that are helpful in understanding the present invention. The memory device includes an array of memory cells 130. The memory cells are preferably non-volatile floating-gate memory cells and generally have their control gates coupled to word lines, drain regions coupled to local bit lines, and source regions commonly coupled to a ground potential. The memory array 130 is arranged in banks of rows and columns. Each bank is arranged in erase blocks. During an erase operation, the memory cells of the erase block are placed in an erased state. Data, however, may be stored in the memory array 130 separate from the block structure.

An address buffer circuit 140 is provided to latch address signals provided on address input connections A0–Ax 142. Address signals are received and decoded by row decoder 144 and a column decoder 146 to access the memory array 130. It will be appreciated by those skilled in the art, with the benefit of the present description, that the number of address input connections depend upon the density and architecture of the memory array. That is, the number of addresses increases with both increased memory cell counts and increased bank and block counts.

The non-volatile memory cells are fabricated as floating gate memory cells and include a source region and a drain region that is spaced apart from the source region to form an intermediate channel region. A floating gate, typically made of doped polysilicon, is disposed over the channel region and is electrically isolated from the other cell elements by oxide. For example, gate oxide can be formed between the floating gate and the channel region. A control gate is located over the floating gate and is can also made of doped polysilicon. The control gate is electrically separated from the floating gate by another dielectric layer. Thus, the floating gate is "floating" in dielectric so that it is insulated from both the channel and the control gate.

The memory cell is programmed using hot electron injection in the channel region near the drain region of the memory cell. These high-energy electrons travel through the gate oxide towards the positive voltage present on the control gate and collect on the floating gale. These electrons remain on the floating gate and function to reduce the effective threshold voltage of the cell as compared to a cell which has not been programmed.

To read a memory cell a control gate (word line) voltage Vg is connected to a pumped voltage Vpx, such as +5 volts provided by pump 180. In addition, the drain voltage Vd is set to a small positive voltage of +1 volts and the source voltage Vs is set to ground potential. The pumped voltage is generated using a memory supply voltage Vcc. If the cell were in a programmed state, the excess electrons present on the floating gate would have increased the threshold voltage to a value in excess of +5 volts. Thus, the control gate Vg to source voltage Vs of +5 volts would not be sufficient to turn on the memory cell. That is, current would not be conducted through the channel region. The resultant lack of cell current indicate that the memory cell was in a programmed state. If the memory cell were in an erased state, the threshold voltage of the cell would be substantially below +5 volts. In that case, the cell would conduct current in response to the control gate voltage that would be sensed to indicate that the cell was in the erased state.

Two conventional alternative sets of conditions for erasing a flash cell are commonly used. In the first method, the control gate voltage Vg is grounded and the drain region is left floating (open), and the source region voltage Vs is connected to a large positive voltage of +12 volts. When these conditions are applied to the cell, a strong electric field is generated between the floating gate and the source region. This field causes the electrons on the floating gate to be transferred to the source region by way of Fowler-Nordheim tunneling.

The above conditions for erasing a cell can be disadvantageous in that the large positive voltage (+12 volts) applied to the source region is difficult to implement in an actual memory system. In another approach, a relatively large negative voltage ranging from –10 to –17 volts is applied to the gate during an erase operation. In addition, the primary supply voltage VCC of +5 volts (or less) is applied to the source region while the drain region is left floating.

The program and erase operations are not performed in single steps. That is, successive program pulses are applied to the memory cells to program a memory cell. This approach reduces over-programming. In a similar manner, the erase operation is iterative. In one embodiment, the erase operation includes three primary steps. The first is a pre-program operation in which all of the memory cells of an erase block are programmed. After all of the cells are pre-programmed, successive erase pulses are applied to the memory cells to remove the pre-program charge from the floating gate. A soft-program operation can be performed to 'heal' any over-erased memory cells.

The memory device reads data in the array 130 by sensing voltage changes in the memory array columns using sense/latch circuitry 150. The sense/latch circuitry, in one embodiment, is coupled to read and latch a row of data from the memory array. The row data can be one continuous address, or comprised of partial rows of discontinuous addresses.

Data input and output buffer circuitry 160 is included for bi-directional data communication over a plurality of data (DQ) connections 162 with the processor 110. The timing of data communication can vary depending upon the architecture. In one embodiment, data read from the memory can be output on the data connections with read latency. Read latency, as known to those skilled in the art, is the number of clock cycles between a read command and available data on the output connections. In addition, the memory can operate in a burst mode and allows read-while-write capabilities to different array banks.

Command control circuit 170 decodes signals provided on control connections 172 from the processor 110. These signals are used to control the operations on the memory array 130, including data read, data write, and erase operations. During operation, commands are provided on the control connections, such as ACTIVE, READ and WRITE commands. An ACTIVE command is used to open (or activate) a row in a particular array bank for a subsequent access. A selected row generally remains active for accesses until the next ACTIVE command. The READ command is used to initiate a read access to an active row. The address connections are used to select a starting column location. Read data appears on the DQs subject to a read latency value. A WRITE command is used to initiate a single-location write access on an active row. Input data appearing on the DQs is written to the memory array by write circuitry 155. The flash memory device has been simplified to facilitate a basic understanding of the features of the memory. A more detailed understanding of internal circuitry and functions of flash memories are known to those skilled in the art.

In some prior memory devices, the memory automatically entered an initialization operation when a reset connection is de-asserted. The initialization operation required about 100 $\mu$s to perform. The initialization operation, therefore, prohibited fast access to the memory array data. Similar to prior devices, the flash memory device of FIG. 1 can be placed in a power down using a reset connection (RP) 175. In one embodiment of the present invention, however, the memory device is placed in a low power consumption mode using the reset connection, but does not automatically start the initialization operation when the reset connection is de-asserted. In contrast, providing the memory device with an initialization command on connections 172 is used to perform an initialization operation.

The non-volatile memory maintains power to the array row latch circuitry 150 during the power down operation. As such, the latched data is immediately available upon power-up without any delay after RP.

In one embodiment, a synchronous flash memory has four banks with 8K bits in each open page per bank. This gives the user access to 32K bits of data after the power down state has ended. As such, the product implementing the flash memory can exit the power-down mode and read the open page while the internal memory voltages are bring restored for the consequent Active cycles.

Figure 2:
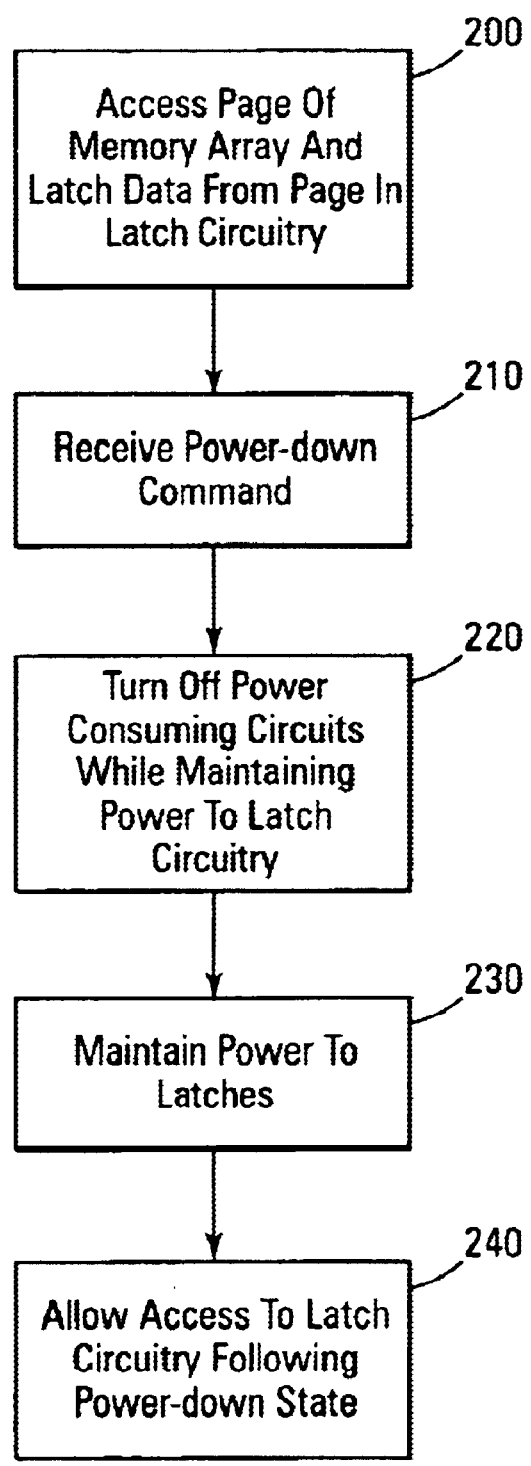
FIG. 2 is a flow chart of operating features of the memory of FIG. 1.

FIG. 2 illustrates a flow chart of the basic operation of an embodiment of the present invention. The memory device has an open row of data accessed and stored in the array latches, 200. When a power-down command is received 210, the memory turns off high power consumption circuits 220. Power is maintained to the latches during the low power state 230. When the memory is commanded to exit the low power state, an external controller, or processor, has access to the contents of the latches 240. The controller maintains the previous open row address such that the controller can identify the data retrieved. If a different array page is desired, the system follows access timing specifications that allow proper voltages to be provided in the memory.

CONCLUSION

A synchronous memory device has been described that includes an array of memory cells. During a read operation data from a row of the array is stored in a latch circuit and randomly read. The memory device can be placed in a low power consumption mode where a voltage pump circuit used to provide an access voltage is powered down. The time required to restart the voltage pump typically limits the speed in which data in the array can be read following a low power mode. The memory device described maintains power to the latch circuit during the low power mode such that the latched data can be read following a low power mode without waiting for the pump circuit to reach a stable output voltage level.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A synchronous memory device comprising:
    a memory array arranged in rows and columns;
    latch circuitry coupled to store a row of data read from the memory array; and
    control circuitry to receive an externally provided command to place the synchronous memory device in a low power consumption mode, wherein the synchronous memory device maintains power to the latch circuitry during the low power consumption mode, the control circuitry allows the stored data in the latch circuitry to be read by an external device following a termination of the low power consumption mode.

2. The synchronous memory device of claim 1 wherein the data read from the latch circuitry following termination of the low power consumption mode has a shorter clock latency than reading data from the array.

3. The synchronous memory device of claim 2 wherein the memory array comprises non-volatile memory cells.

4. The synchronous memory device of claim 1 wherein the externally provided command is an active signal on a reset connection, and the low power consumption mode is terminated in response to an in-active signal on the reset connection.

5. A flash memory device comprising:
    an array of non-volatile memory cells arranged in rows and columns;
    latch circuitry coupled to store a row of data read from the memory array; and
    control circuitry coupled to place the memory device in a low power mode, wherein the memory device maintains power to the latch circuitry during the low power mode, the control circuitry allows the stored data in the latch circuitry to be read by an external device following a termination of the low power mode, wherein the data read from the latch circuitry following termination of the low power consumption mode has a shorter clock latency with respect to the external device than reading data from the array.

6. The flash memory device of claim 5 wherein the externally provided command is an active signal on a reset connection, and the low power mode is terminated in response to an in-active signal on the reset connection.

7. A memory system comprising:
    a processor; and
    a flash memory device coupled to the processor, the flash memory device comprises,
        an array of non-volatile memory cells arranged in rows and columns,
        latch circuitry coupled to store a row of data read from the memory array, and
        control circuitry to receive an externally provided command from the processor to place the memory device in a low power mode, wherein the memory device maintains power to the latch circuitry during the low power mode such that the row of data can be output when the memory device exits the low power mode.

8. The memory system of claim 7 wherein the processor provides a command to instruct the memory device to exit the low power mode.

9. The memory system of claim 8 wherein the processor reads the data stored in the latch circuitry after the memory device to exits the low power mode.

10. A flash memory device comprising:

an array of non-volatile memory cells arranged in rows and columns;

latch circuitry coupled to store a row of data read from the memory array; and control circuitry to place the memory device in a low power mode by decoupling power to the array, wherein the memory device maintains power to the latch circuitry during the low power mode, the control circuitry allows the stored data in the latch circuitry to be read by an external device following a termination of the low power mode, wherein accessing the stored data in the latch circuitry is performed in less clock cycles than reading data stored in the array.

11. A method of operating a memory device comprising:

reading a row of data from a memory array of the memory device;

storing the read row data in a volatile latch circuit;

in response to an externally provided command, activating a first power supply to the array to place the array in a low power mode; and maintaining a second power supply to the latch circuit such that an integrity of the read row data is maintained during the low power mode.

12. The method of claim 11 wherein the read row data is selectively output following a termination of the low power mode.

13. The method of claim 11 wherein the second power supply is an external supply, Vcc, and the first power supply is an elevated voltage supply greater than Vcc and coupled to wordlines of the memory array.

14. The method of claim 13 wherein the first power supply is generated by pumping the second power supply.

15. A method of operating a flash memory device comprising:

accessing a page of data of a memory array;

latching the accessed page;

in response to an externally provided command, powering down the flash memory device to a low power state, such that array access circuitry of the flash memory device is non-functional;

powering up the flash memory device such that the array access circuitry is functional;

reading the latched page while the array access circuitry of the flash memory device is non-functional.

16. The method of claim 15 wherein the latched page is stored in a volatile latch that remains powered up while the flash memory device is in the low power state.

17. The method of claim 15 wherein the flash memory consumes less than 100 $\mu$A when in the low power state.

18. The method of claim 15 wherein the flash memory device is powered up in response to another externally provided command.

19. The method of claim 18 wherein the latched page is read within 1 $\mu$S following the externally provided command.

20. A method of operating a flash memory device comprising:

accessing a page of data of a memory array;

latching the accessed page;

powering down the flash memory device to a low power state, such that a voltage pump provided to generate an elevated access voltage is turned off;

powering up the flash memory device such that the voltage pump is turned on, wherein the voltage pump requires X seconds to reach a stable pumped output voltage; and reading the latched page during the X seconds and prior to the voltage pump reaching a stable pumped output voltage.

* * * * *

UNITED STATES PATENT AND TRADEMARK OFFICE
CERTIFICATE OF CORRECTION

PATENT NO. : 6,747,911 B2
DATED : June 8, 2005
INVENTOR(S) : Frankie Fariborz Roohparvar It is certified that error appears in the above-identified patent and that said Letters Patent is hereby corrected as shown below:

Column 2,
Line 19, "all elevated access voltage is turned off." should read -- an elevated access voltage is turned off. --.

Column 3,
Line 14, "processor 10 may form part of an electronic system 120." should read -- processor 110 may form part of an electronic system 120. --.
Line 56, "control gate and collect on the floating gale" shoud read -- control gate and collect on the floating gate. --.

Signed and Sealed this

Thirty-first Day of January, 2006

JON W. DUDAS
*Director of the United States Patent and Trademark Office*

UNITED STATES PATENT AND TRADEMARK OFFICE
CERTIFICATE OF CORRECTION

PATENT NO. : 6,747,911 B2
DATED : June 8, 2004
INVENTOR(S) : Frankie Fariborz Roohparvar It is certified that error appears in the above-identified patent and that said Letters Patent is hereby corrected as shown below:

Column 2,
Line 19, "all elevated access voltage is turned off." should read -- an elevated access voltage is turned off. --.

Column 3,
Line 14, "processor 10 may form part of an electronic system 120." should read -- processor 110 may form part of an electronic system 120. --.
Line 56, "control gate and collect on the floating gale" shoud read -- control gate and collect on the floating gate. --.

This certificate supersedes Certificate of Correction issued January 31, 2006.

Signed and Sealed this

Seventh Day of March, 2006

JON W. DUDAS
*Director of the United States Patent and Trademark Office*